United States Patent [19]

Lin et al.

[11] Patent Number: 4,941,700
[45] Date of Patent: Jul. 17, 1990

[54] GATE ARRAY IC PULLER

[76] Inventors: Huoo-Shuenn Lin, No. 23, Lane 4, Chih Huei Street, Pan Chiao; Juh-San Hsu, No. 22, Chang-Chun Three Street, Taipei, both of Taiwan

[21] Appl. No.: 250,757

[22] Filed: Sep. 28, 1988

[51] Int. Cl.⁵ .................... B25J 15/12; H05K 13/04
[52] U.S. Cl. .................... 294/99.2; 29/740; 29/764
[58] Field of Search ............. 294/99.2, 33, 16, 99.1, 294/100; 29/259, 261, 740, 758, 762, 764, 278

[56] References Cited

U.S. PATENT DOCUMENTS

| | | | |
|---|---|---|---|
| 1,243,771 | 10/1917 | Singer | 294/99.2 X |
| 1,714,822 | 5/1929 | Segal | 294/99.2 X |
| 3,443,297 | 5/1969 | Lusby | 29/764 X |
| 3,699,629 | 10/1972 | Hood, Jr. et al. | 29/764 X |
| 3,974,556 | 8/1976 | Kubik | 29/764 X |
| 4,033,032 | 7/1977 | Romania et al. | 29/764 X |
| 4,583,287 | 4/1986 | McDevitt et al. | 29/764 X |
| 4,604,796 | 8/1986 | Tsipenyuk et al. | 29/764 X |

FOREIGN PATENT DOCUMENTS 3214792  11/1983  Fed. Rep. of Germany ........ 29/764

*Primary Examiner*—Johnny D. Cherry
*Attorney, Agent, or Firm*—Brumbaugh, Graves, Donohue & Raymond

[57] ABSTRACT

The present invention relates to a puller for pulling out Gate Array ICs having an axial rod centered into a cylindrical pipe. There is a buffer spring inside the cylindrical pipe and a round pressing board is attached to the bottom of the cylindrical pipe. A steel hook is fixed to the center of the axial rod with both ends bent in at 90°. An arch spring is fixed to the axial rod right above the steel hook and extends downward. The two 90° ends of the steel hook penetrate two holes at the ends of the arch spring. In using this invention, one may hold and press both sides of the arch spring, plug the two 90° ends of the steel hooks into the diagonal holes of a chip carrier and pull the chip. The buffer spring pushes upward against the axial rod to reform the arch spring and the steel hooks so as to pull out the Gate Array IC.

6 Claims, 3 Drawing Sheets

GATE ARRAY IC PULLER

BACKGROUND OF THE INVENTION

The present invention relates to a tool for pulling out Gate Array Integrated Circuits from a printed Circuit Board. The computer is known for its enlightenment of mankind as a hi-tech product which shortens the time spent on various scientific operations. The progress of computer design and the development of technology has been quite rapid. An eight-bit Apple II personal computer was developed around ten years ago and today sixteen-bit and thirty-two-bit personal computers are commonplace in the PC markets. Although the appearance and volume of personal computers have not changed significantly, the data processing speed and memory size have increased dramatically. When a PC is opened, the Gate Array IC package is revealed. These complicated integrated circuits, that are small in size, play an important role in the function of a PC. However, bugs may occur in these chips which causes the need to replace the chip. Pulling out the complex IC thus becomes detailed work. Therefore, a more practical PC tool is needed to accomplish this.

The gate Array IC Puller is designed as a practical tool for computer maintenance. Because the Gate Array IC is plugged into a chip carrier with many compactly adjacent pins on its edge, the only way to extract a Gate Array IC from its chip carrier is to insert a Gate Array IC Puller into two diagonal holes (1.5 mm wide, 2.0 mm long and 5.0 mm deep each), hold the IC firmly and pull the IC out of the carrier. With other tools such as a screw-driver, a needle, or a common IC extractor, this will not only take longer but also may ruin the sensitive chip.

Other IC extractors currently used in the electronics industry have major disadvantages with include:
1. the extractor is not compatible with all types and all dimensions of Gate Array ICs,
2. the extractor is made of fragile material, rough in outline and of no commercial value,
3. it is difficult to operate,
4. serious collision occurs at the instance of pulling out the IC, damaging pins and the internal construction of the Gate Array IC.

In order to overcome the disadvantages listed above, the applicants have created the following invention.

SUMMARY OF THE INVENTION

According to the present invention there is provided a puller for pulling out Gate Array ICs having an elongated axial rod or bolt centered into a cylindrical pipe. There is a spring inside the cylindrical pipe with a round pressing board attached to the bottom of the cylindrical pipe. A steel hook is fixed to the center of the axial rod with both ends bent in at 90°. An arch spring is fixed to the axial rod above the point of attachment of the steel hook and extends downwardly. The two in-turn ends of the steel hook extend through respective rings attached at the lower ends of the arch spring. In use, both members of the arch spring are pressed together by hand-manipulation to narrow the space between the opposed turned-in ends of the hook to engage the diagonal holes of a chip carrier. The buffer spring pushes upward against the axial rod to reform the arch spring and the steel hooks so as to pull out the Gate Array IC.

A more complete understanding of the features and advantages of the invention will become more apparent from the following description taken in conjunction with the accompanying drawings.

DESCRIPTION OF THE PREFERRED EMBODIMENTS

Figure 1:
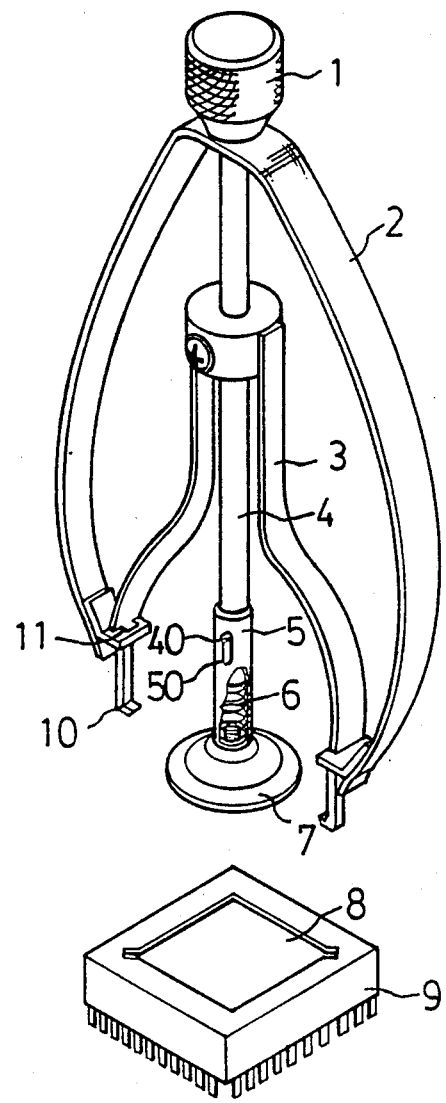
FIG. 1 is a perspective view of a chip puller constructed according to the invention and a Gate Array IC.
Figure 2A:
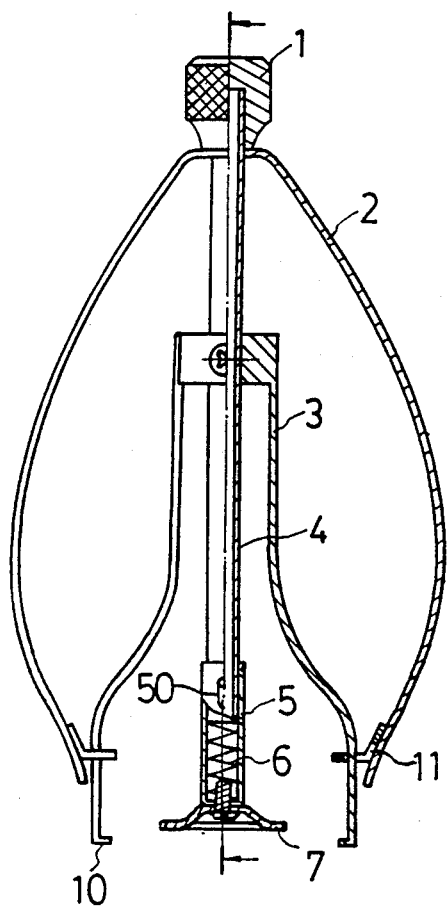
FIG. 2A is a cross-sectional view of the chip puller of FIG. 1.
Figure 2B:
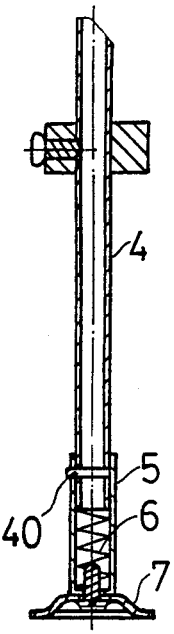
FIG. 2B is an enlarged fragmentary cross-sectional view showing the construction of the presser board.

Referring to FIG. 1 and FIG. 2, the chip puller according to the invention includes an outer arch spring 2 consisting of a pair of opposed bowed flat spring members joined together at an apex at which it is secured to the upper end of an elongated axial bolt or rod 4, which passes through a hole in the spring centered at the apex, by a nut 1. The opposed spring members are disposed in a vertical plane which includes axial bolt 4 and extend downwardly to near the lower end of the bolt.

A hook 3, consisting of a pair of opposed flat steel spring members secured to a ring member, is fixed to the axial bolt 4 at a point below the apex of the arch spring. These spring members are disposed in the same vertical plane as arch spring 2 and extend downwardly substantially parallel to the bolt 4 and for a portion of their length and then bow outwardly and respectively pass through a hole in a ring 11 secured at the lower inside surface of each of the flat springs of arch spring 2; the portion extending below the rings is narrower than the portion of the springs above the rings and their lower ends are bent in at 90° to form a pair of inwardly directed extensions 10, typically 5 mm long. The axial position of the ring member along bolt 4 is adjustable to fit different types of Gate Array ICs.

A pressing board 7 is installed at the lower end of axial rod 4 for engaging the upper surface 8 of an integrated circuit package 9 to be pulled. The pressing board 7, in the form of a disk, is secured to the lower end of a cylindrical pipe 5 telescopically affixed to the lower end of axial rod 4. The presser board is urged downwardly by a buffer spring 6 positioned within pipe 5 and may be moved upwardly against the force of the spring upon engagement with an IC package; the extent of travel of the presser board is limited by the length of a slot 50 formed in the wall of pipe 5 and a pin 40 secured to rod 4 and extending through the slot.

Figure 3A:
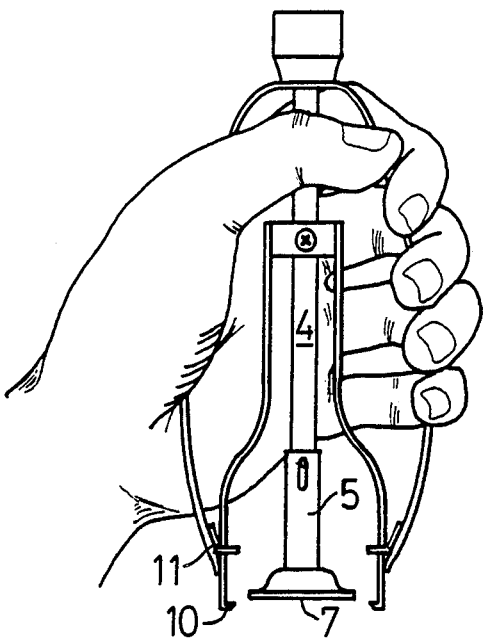
FIG. 3A is a perspective view of the chip puller in use, in its open position.
Figure 3B:
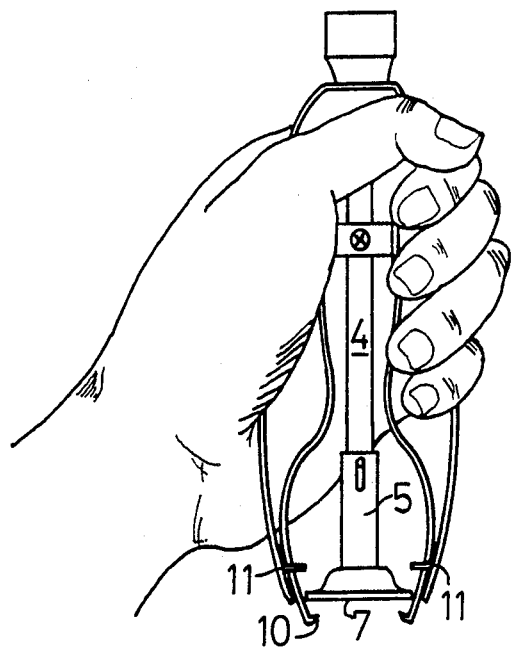
FIG. 3B is a perspective view of the chip puller use, in its closed position.

Referring to FIGS. 3A and 3B, in using the tool the outer spring members which form the arch spring 2 are grasped between the thumb, forefinger and middle finger and squeezed slightly to move the hooks 10 toward each other to have a spacing corresponding to the spacing between two holes formed at diagonal corners of the chip carrier (as shown in FIG. 1). The steel hooks 10 are directed into and pushed to the bottom of the holes. At the same time, the springloaded pressing board 7 presses on the IC and together with steel hook 3 holds the IC. Then, the members of arch spring 2 are again secured by the thumb, forefinger and middle finger to cause the in-turned extensions 10 to hook up the bottom of the IC adjacent the diagonally placed holes, and then the arch spring 2 extends to pull the Gate Array IC out of its chip carrier. Alternatively, the Gate Array IC Puller may be held in the palm of the hand, holding both members of arch spring 2 for controlling the curvature of the members forming steel hook 3, and then operating the Puller in the manner described above.

The elements of the puller are configured to set a distance of 50 mm between the opposing ends of steel hooks 10, which is the adopted specification of the biggest (84 pin) Gate Array IC. In order to pullout smaller ICs (for example, with 68 pins), the size of the puller can easily be changed by pressing arch spring 2.

We claim:

1. A tool for pulling an integrated circuit chip having width and top and bottom surfaces from a printed circuit board comprising:
    an elongated bolt having upper and lower ends,
    a presser board member affixed to the lower end of said elongated bolt moveable from a normal lower position to an upper position for engaging the top surface of an integrated circuit chip,
    an inner pair of opposed flat spring members each secured at an upper end to said elongated bolt and at the other end having a pair of inwardly directed opposed hooks normally spaced a predetermined distance from each other, and
    an outer pair of opposed bowed, handmanipulable flat spring members each secured at an upper end to the upper end of said elongated bolt and disposed in the same vertical plane as said inner pair of spring members, and each having at a lower end a ring slidably receiving a corresponding spring member of said inner pair, whereby when said outer spring members are pressed together, the spacing between said opposed hooks is narrowed to a spacing less than said predetermined distance for engaging the underside of an integrated circuit chip.

2. A tool for pulling an integrated circuit chip according to claim 1, wherein said presser board member includes spring means normally pressing said presser board to said lower position.

3. A tool for pulling an integrated circuit chip according to claim 1, wherein said presser board is telescopically affixed to the lower end of said elongated bolt and spring-biased to said lower position.

4. A tool for pulling an integrated circuit chip according to claim 1, wherein said inner pair of opposed flat spring members are secured to a ring member, and wherein said ring member is secured to said elongated bolt at the upper end thereof.

5. A tool for pulling an integrated circuit chip according to claim 1, wherein said outer pair of flat spring members comprise first and second bowed members integrally joined together at an apex and having an opening located at said apex through which the upper end of said elongated bolt extends.

6. A tool for pulling an integrated circuit chip having width and top and bottom surfaces from a printed circuit board comprising:
    en elongated bolt having upper and lower ends;
    a ring member secured to said bolt at a location between said upper and lower ends;
    a presser board member telescopically affixed to the lower end of said elongated bolt to be moveable from a normal lower position to an upper position and including spring means normally pressing said presser board to said lower position;
    an inner pair of opposed flat spring members each secured at an upper end to said ring member and at their other ends having a pair of inwardly directed opposed hooks normally spaced a predetermined distance from each other;
    an outer pair of opposed bowed, flat spring numbers integrally joined together at an apex and secured at said apex to the upper end of said bolt and extending downwardly therefrom, said outer pair of spring members being disposed in the same vertical plane as said inner pair of spring members and each having at its lower end a ring through which a corresponding spring member of said inner pair is slidably received, said inner and outer spring members having relative curvatures such that when said outer spring members are pressed together by hand-manipulation the spacing between said opposed hooks is narrowed sufficiently to engage the underside of an integrated circuit chip having width and top and bottom surfaces from a printed circuit board comprising:
    an elongated bolt having upper and lower ends;
    a ring member secured to said bolt at a location between said upper and lower ends;
    a presser board member telescopically affixed to the lower end of said elongated bolt to be moveable from a normal lower position to an upper position and including spring means normally pressing said presser board to said lower position;
    an inner pair of opposed flat spring members each secured at an upper end to said ring member and at their other ends having a pair of inwardly directed opposed hooks normally spaced a predetermined distance from each other;
    an outer pair of opposed bowed, flat spring numbers integrally joined together at an apex and secured at said apex to the upper end of said bolt and extending downwardly therefrom, said outer pair of spring members being disposed in the same vertical plane as said inner pair of spring members and each having at its lower end a ring through which a corresponding spring member of said inner pair is slidably received, said inner and outer spring members having relative curvatures such that when said outer spring members are pressed together by hand-manipulation the spacing between said opposed hooks is narrowed sufficiently to engage the underside of an integrated circuit chip.

* * * * *

UNITED STATES PATENT AND TRADEMARK OFFICE
CERTIFICATE OF CORRECTION

PATENT NO. : 4,941,700

DATED : July 17, 1990

INVENTOR(S) : Lin et al.

It is certified that error appears in the above-identified patent and that said Letters Patent is hereby corrected as shown below:

Col. 4, line 30, "chip having" should read --chip.--.

Col. 4, delete lines 31 through 59.

Signed and Sealed this

Twenty-first Day of April, 1992

Attest:

HARRY F. MANBECK, JR.

*Attesting Officer*  *Commissioner of Patents and Trademarks*